United States Patent
Benz

(10) Patent No.: US 7,563,546 B2
(45) Date of Patent: Jul. 21, 2009

(54) PROCESS FOR CREATING PHASE EDGE STRUCTURES IN A PHASE SHIFT MASK

(75) Inventor: Jason M. Benz, South Burlington, VT (US)

(73) Assignee: International Business Machiens Corporation, Armonk, NY (US)

( * ) Notice: Subject to any disclaimer, the term of this patent is extended or adjusted under 35 U.S.C. 154(b) by 355 days.

(21) Appl. No.: 10/707,908

(22) Filed: Jan. 23, 2004

(65) Prior Publication Data

US 2005/0164097 A1 Jul. 28, 2005

(51) Int. Cl.
*G03F 1/00* (2006.01)
*G03F 1/08* (2006.01)
(52) U.S. Cl. .......................................................... 430/5
(58) Field of Classification Search ....................... 430/5
See application file for complete search history.

(56) References Cited

U.S. PATENT DOCUMENTS

| | | | | |
|---|---|---|---|---|
| 5,302,477 A | * | 4/1994 | Dao et al. | 430/5 |
| 5,888,678 A | * | 3/1999 | Tzu et al. | 430/5 |
| 6,251,549 B1 | * | 6/2001 | Levenson | 430/11 |
| 6,395,432 B1 | * | 5/2002 | Rolfson | 430/5 |
| 2002/0004175 A1 | | 1/2002 | Levenson | 430/5 |
| 2002/0015899 A1 | | 2/2002 | Chen et al. | 430/5 |
| 2002/0125443 A1 | * | 9/2002 | Sandstrom | 430/5 |
| 2003/0027057 A1 | * | 2/2003 | Schroeder et al. | 430/5 |

* cited by examiner

*Primary Examiner*—Mark F Huff
*Assistant Examiner*—John Ruggles
(74) *Attorney, Agent, or Firm*—Gibb I.P. Law Firm, LLC; Richard M. Kotulak, Esq.

(57) ABSTRACT

Disclosed is a method for forming an optical mask that has reduced processing steps. The invention performs a first patterning of an opaque chrome layer to expose a first region of a transparent quartz substrate and ten etches the first region of the transparent quartz substrate through the chrome layer to create a phase shift region within the transparent quartz substrate. Next, the invention performs additional patterning of the opaque chrome layer to expose a second region of the transparent quartz substrate that is adjacent to the first region. This additional patterning process enlarges the opening formed in the opaque mask formed in the first patterning process. The first region and the second region comprise a continuous area of the transparent quartz substrate.

14 Claims, 4 Drawing Sheets

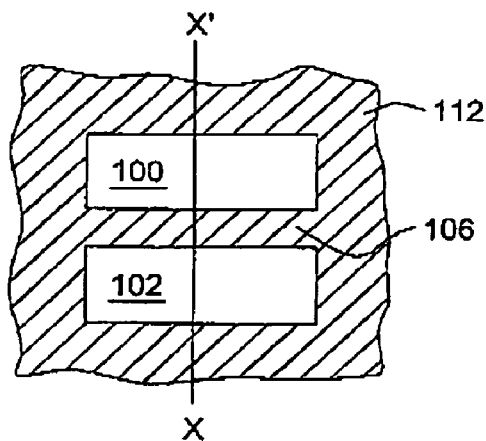
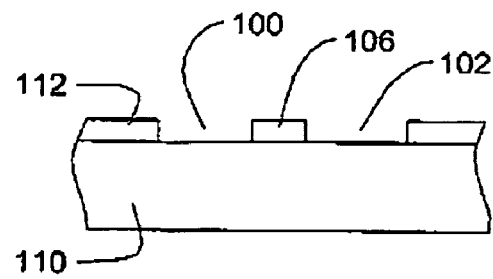
FIG. 1A
PRIOR ART
FIG. 1B
PRIOR ART
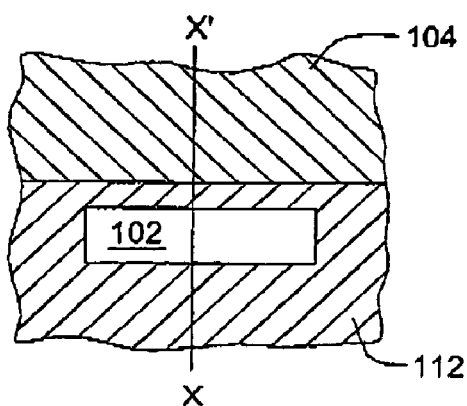
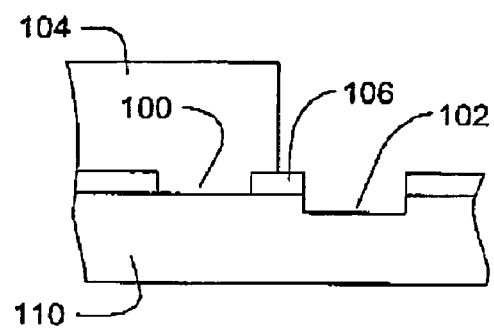
FIG. 2A
PRIOR ART
FIG. 2B
PRIOR ART
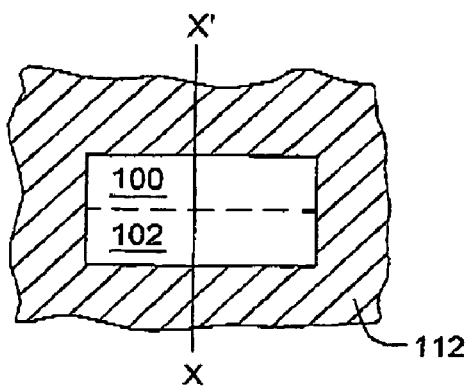
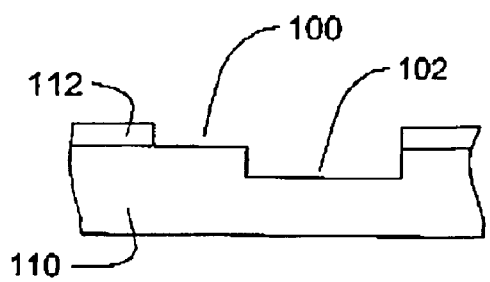
FIG. 3A
PRIOR ART
FIG. 3B
PRIOR ART

PROCESS FOR CREATING PHASE EDGE STRUCTURES IN A PHASE SHIFT MASK

BACKGROUND OF INVENTION

1. Field of the Invention

The present invention generally relates to a process which can reduce the complexity of the design and processing required to fabricate a phase edge on an alternating phase-shift photomask.

2. Description of the Related Art

As features being patterned using optical masks are reduced in size below the wavelengths of light, the optical masks have been designed with compensating features such as phase shift regions. These types of masks are often referred to as phase shift masks. There are many methodologies used to create such masks and an improved methodology is discussed below.

SUMMARY OF INVENTION

The invention provides a method of forming a phase shift mask that begins by forming an opaque chrome layer (mask) on a transparent quartz substrate. The invention performs a first patterning of the opaque chrome layer to expose a first region of the transparent quartz substrate and then etches the first region of the transparent quartz substrate through the chrome layer to create a phase shift region within the transparent quartz substrate. Next, the invention performs additional patterning of the opaque chrome layer to expose a second region of the transparent quartz substrate that is adjacent the first region. This additional patterning process enlarges the opening formed in the opaque mask in the first patterning process. The first region and the second region can comprise a continuous area of the transparent quartz substrate. The first region can comprise a rectangle, and the second region can comprise a similarly shaped and sized rectangle as the first region.

The process here is beneficial because it eliminates levels of processing, as well as reduces the complexity of processing. The fact that less lithography levels are required immediately reduces the number of design levels (design complexity, data volume, etc.). Reduction in lithography levels also reduces the process complexity, and length (i.e., better yields, and turn around time (TAT)). With the invention, the overlay requirements for each level also become less stringent, which improves yield, and TAT.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not by way of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which:

FIGS. 1A and 1B are schematic top-view and cross-sectional view diagrams of an optical mask;

FIGS. 2A and 2B are schematic top-view and cross-sectional view diagrams of an optical mask;

FIGS. 3A and 3B are schematic top-view and cross-sectional view diagrams of an optical mask;

DETAILED DESCRIPTION

Figure 4A:
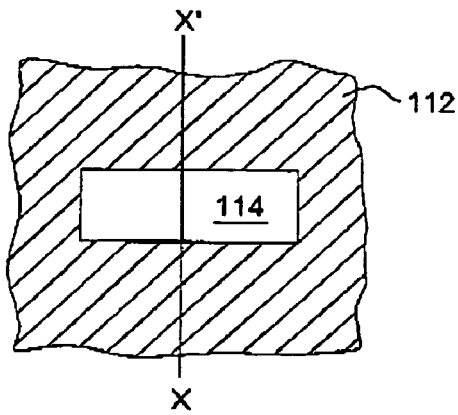
FIGS. 4A and 4B are schematic top-view and cross-sectional view diagrams of an optical mask.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

FIGS. 1A-3B illustrate a methodology that is utilized to create a phase shift mask. This methodology is not necessarily well known; however, the invention is an improvement on this methodology. More specifically, FIG. 1A illustrates a top view of a patterned opaque layer 112 (e.g., chrome) over a transparent substrate 110 (e.g., quartz). FIG. 1B illustrates the same structure in cross-sectional view along line X-X'. The pattern includes two openings 100, 102 in the opaque material 112 that are separated by a narrow region of opaque material 106. While only two openings are shown in the patterned opaque mask, one ordinarily skilled in the art would understand that the mask would normally include many more openings representing design features, and that the drawings used herein are substantially simplified to allow the salient features of the invention to be clearly recognized.

In FIGS. 2A-2B, which again are top and cross-sectional views (drawn along line X-X'), a mask 104 is patterned to protect one of the openings 100. The other opening 102 is then etched to create a recess in the transparent substrate 110. The mask is subsequently removed, as shown in FIGS. 3A-3B, and the separating portion of opaque material 106 is also removed (using a number of different methods such as additional masking and etching, etc.). This produces a larger opening (openings 100 and 102 combined) that has a phase shift feature where light passing through portion 100 is shifted 180 degrees from the light passing through portion 102.

Figure 4B:
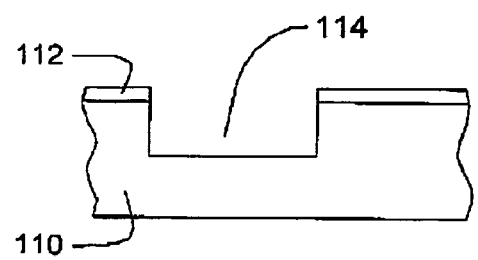

This process shown in FIGS. 1A-3B involves a number of masking, patterning, photolithographic, etching, etc. techniques. The invention shown in FIGS. 4A-6B substantially simplifies the process to produce the same structure. As with previous drawings, FIGS. 4A-6A are top views and FIGS. 4B-6B are cross-sectional views drawn along line X-X'. As shown in FIGS. 4A and 4B, the invention performs a first patterning of the opaque layer 112 to expose a first region 114 of the transparent substrate 110. The invention then etches the first region 114 of the transparent substrate 110 through the opaque layer 112 to create a phase shift region within the transparent substrate 110, as shown in FIGS. 4A and 4B.

Figure 5A:
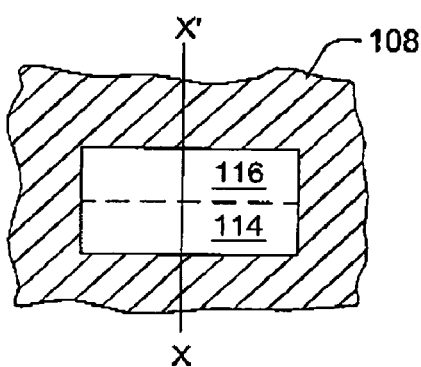
FIGS. 5A and 5B are schematic top-view and cross-sectional view diagrams of an optical mask.
Figure 5B:
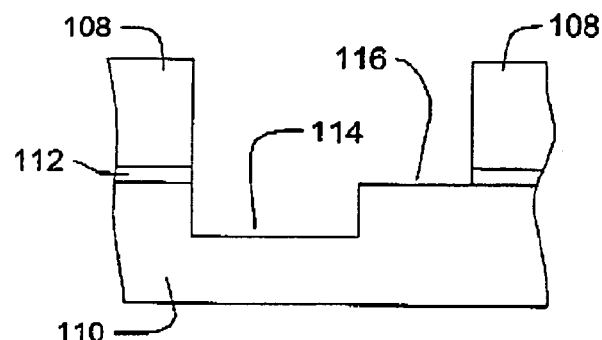

Next, the invention performs additional patterning of the opaque layer 112 to expose a second region 116 of the transparent substrate 110 that is adjacent (contiguous with) the first region 114 using any well-known mask 108 and material removal process, as shown in FIGS. 5A and 5B. This additional patterning process enlarges the opening 114 formed in the first patterning process to add the second region 116. The mask is then removed as shown in FIGS. 6A and 6B.

The first region 114 and the second region 116 comprise a continuous area 114, 116 of the transparent substrate. In this example, the first region 114 comprises a rectangle and the second region 116 comprises a similarly shaped and sized rectangle as the first region; however, one ordinarily skilled in the art would understand that these openings can have any shape and can be different shapes. In addition, as discussed above, while only a limited number of openings are shown in the patterned opaque mask, one ordinarily skilled in the art would understand that the mask would normally include many more openings representing design features, and that the drawings used herein are substantially simplified to allow the salient features of the invention to be clearly recognized.

Figure 6A:
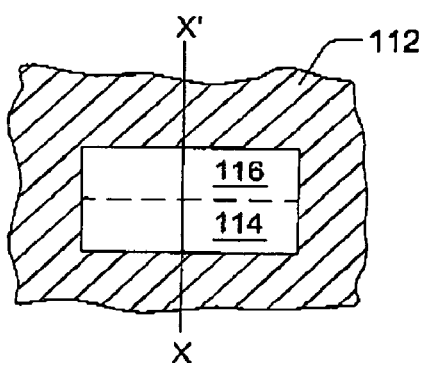
FIGS. 6A and 6B are schematic top-view and cross-sectional view diagrams of an optical mask.
Figure 6B:
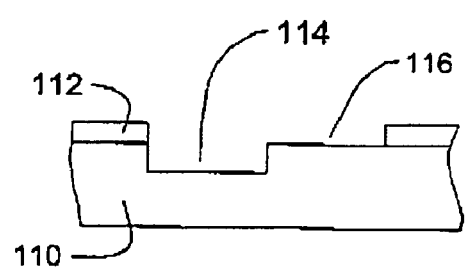
Figure 7A:
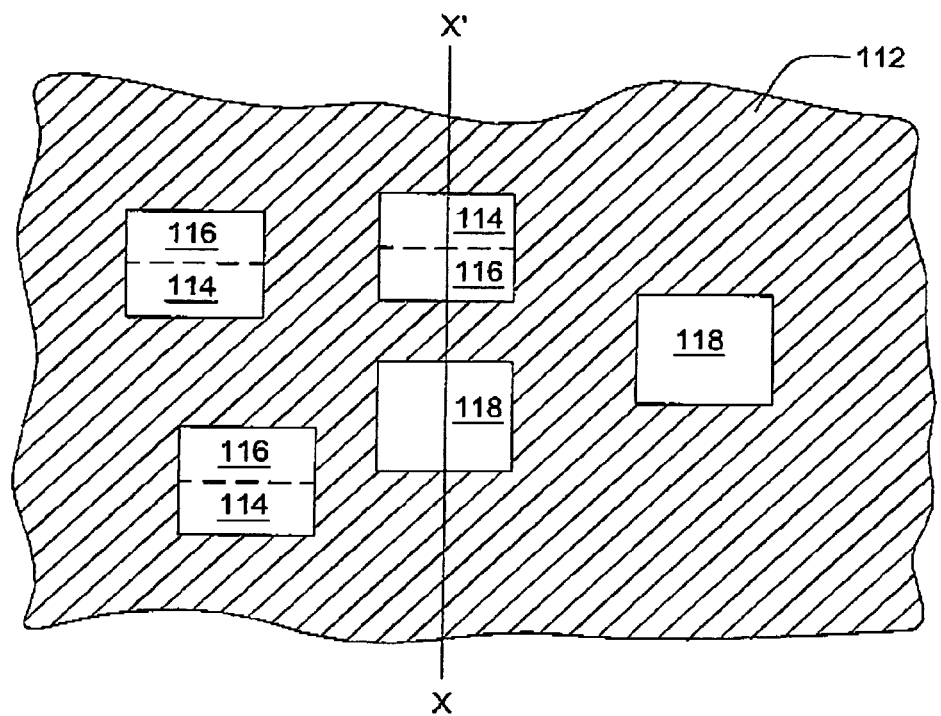
FIGS. 7A and 7B are schematic top-view and cross-sectional view diagrams of an optical mask.
Figure 7B:
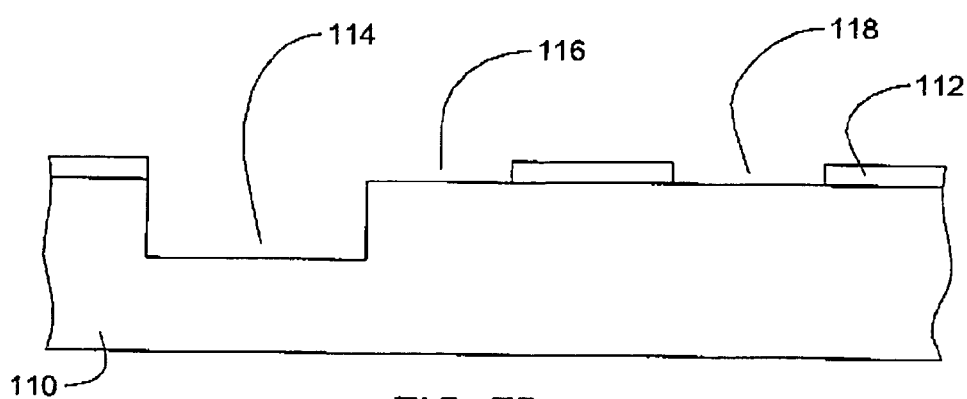

FIGS. 7A-7B are similar to FIGS. 6A-6B; however FIGS. 7A-7B illustrate additional regions 118 that are features patterned into the opaque mask. These additional features 118 are contrasted with features 114, 116 in that features 118 do not include phase shift components. Therefore, the invention can be used to form a number of different types of masks, including those with phase shift features only in some regions of the mask.

Figure 8:
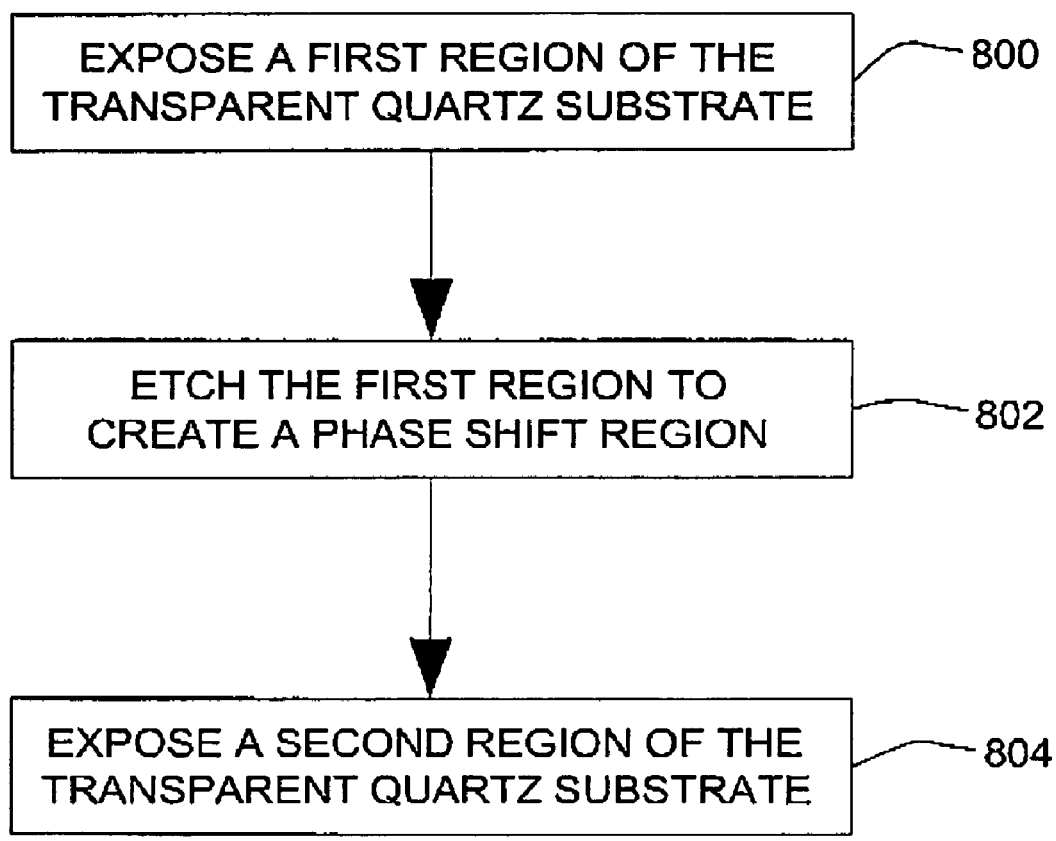
FIG. 8 is a flow diagram illustrating a preferred method of the invention.

FIG. 8 shows the processing of the invention in flowchart form. More particularly, in item 800, the invention performs a first patterning of the opaque chrome layer to expose a first region of the transparent quartz substrate. In item 802, the invention etches the first region of the transparent quartz substrate through the chrome layer to create a phase shift region within the transparent quartz substrate. Next, the invention performs additional patterning of the opaque chrome layer to expose a second region of the transparent quartz substrate that is adjacent the first region, in item 804. This additional patterning process enlarges the opening formed in the first patterning process. The processing here is beneficial for a number of different reasons. In one example, the invention eliminates various levels of processing, and reduces the complexity of that processing. The fact that less lithographic levels are required immediately reduces the number of design levels (design complexity, data volume, etc.). Reduction in lithographic processing levels also reduces the process complexity, and length (i.e., yield, TAT, capacity, defects, raw process time (RPT)). With the invention, the overlay requirements for each level also become less stringent, which improves yield, and TAT.

With the invention, the etch process window and capability are improved because the resist is removed from the etch system. Etching without resist reduces ARDE (Aspect Ratio Dependent Etching), and any chemistry effects the resist may add to the etch system.

Overlay requirements are relaxed with the invention because in the original method (illustrated in FIGS. 1A to 3B), the second level lithography process had to land on the opaque region (106) between the two clear openings (100 and 102, as shown in FIG. 2B). However, in the second process of the embodiments of the invention (illustrated in FIGS. 4A to 5B), the second lithography process only has to hit the large opening (114 and 116 as shown in FIG. 5B, which provides more room for error).

While the invention has been described in terms of preferred embodiments, those skilled in the art will recognize that the invention can be practiced with modification within the spirit and scope of the appended claims.

The invention claimed is:

1. A method of forming a phase shift mask, said method comprising:
    forming an opaque layer on a transparent substrate;
    performing a first patterning of said opaque layer to expose a first region of said transparent substrate, wherein said first region comprises an uninterrupted rectangular shape:
    etching said first region of said transparent substrate to create a phase shift region comprising an uninterrupted rectangular surface within said transparent substrate; and
    performing additional patterning of said opaque layer to expose a second region of said transparent substrate, wherein said additional patterning includes said second region and first region, said additional patterning with one side of said first region, and said additional patterning exposes an uninterrupted rectangular shape in said second region on said opaque layer immediately adjacent and substantially similar in shape and size to said first region, and
    removing said opaque layer within said second region to create an uninterrupted rectangular surface on said transparent substrate,
    wherein said process enlarges an opening in said opaque layer formed in said first patterning process.

2. The method in claim 1, wherein said first region and said second region comprise a continuous area of said transparent substrate.

3. The method in claim 1, wherein said opaque layer comprises a chrome mask.

4. The method in claim 1, wherein said transparent substrate comprises a quartz substrate.

5. The method in claim 1, wherein said uninterrupted rectangular surface lacks an intervening structure.

6. A method of forming a phase shift mask, said method comprising:
    forming an opaque layer on a transparent substrate;
    performing a first patterning of said opaque layer to expose first regions of said transparent substrate, wherein said first regions comprise uninterrupted rectangular shapes;
    etching said first regions of said transparent substrate to create phase shift regions comprising uninterrupted rectangular surfaces within said transparent substrate; and
    performing additional patterning of said opaque layer to expose second regions and third regions of said transparent substrate, such that said additional patterning includes said second regions and said first regions, said additional patterning is vertically aligned with one side of said first regions, and said additional patterning exposes uninterrupted rectangular shapes in said second regions on said opaque layer immediately adjacent and substantially similar in shape and size to said first regions, and said third regions are separated from said first regions, such that said third regions are devoid of phase shift features, and wherein said additional patterning process enlarges openings in said opaque layer formed in said first patterning process.

7. The method in claim 6, wherein each pair of said first regions and said second regions comprises a continuous area of said transparent substrate.

8. The method in claim 6, wherein said opaque layer comprises a chrome mask.

9. The method in claim 6, wherein said transparent substrate comprises a quartz substrate.

10. The method in claim 6, wherein said uninterrupted rectangular surfaces lack intervening structures.

11. A method of forming a phase shift mask, said method comprising:
- forming an opaque chrome layer on a transparent quartz substrate;
- performing a first patterning of said opaque chrome layer to expose a first region of said transparent quartz substrate, wherein said first region comprises an uninterrupted rectangular shape;
- etching said first region of said transparent quartz substrate to create a phase shift region comprising an uninterrupted rectangular surface within said transparent quartz substrate; and
- performing additional patterning of said opaque chrome layer to expose a second region of said transparent quartz substrate, wherein said additional patterning includes said second region and first region, said additional patterning is vertically aligned with one side of said first region, and said additional patterning exposes an uninterrupted rectangular shape in said second region on said opaque layer immediately adjacent and substantially similar in shape and size to said first region, and
- removing said opaque layer within said second region to create an uninterrupted rectangular surface on said transparent quartz substrate,
- wherein said additional patterning process enlarges an opening in said opaque layer formed in said first patterning process.

12. The method in claim 11, wherein said first region and said second region comprise a continuous area of said transparent quartz substrate.

13. The method in claim 11, wherein said opaque chrome layer comprises a chrome mask.

14. The method in claim 11, wherein said uninterrupted rectangular surface lacks an intervening structure.

* * * * *